United States Patent [19]
Yasuoka

[11] Patent Number: 5,256,893
[45] Date of Patent: Oct. 26, 1993

[54] SEMICONDUCTOR INTEGRATED CIRCUIT DEVICE WITH POWER MOSFET INCORPORATED

[75] Inventor: Hideki Yasuoka, Takasaki, Japan

[73] Assignee: Hitachi, Ltd., Tokyo, Japan

[21] Appl. No.: 995,051

[22] Filed: Dec. 22, 1992

Related U.S. Application Data

[63] Continuation of Ser. No. 779,855, Oct. 21, 1991, abandoned, which is a continuation of Ser. No. 528,897, May 29, 1990, abandoned, which is a continuation of Ser. No. 221,372, Jul. 19, 1988, abandoned.

[30] Foreign Application Priority Data

Jul. 22, 1987 [JP] Japan .................................. 62-181101

[51] Int. Cl.⁵ ...................... H01L 29/10; H01L 27/02
[52] U.S. Cl. .................... 257/335; 257/341; 257/346; 257/378
[58] Field of Search .............. 257/335, 337, 341, 342, 257/346, 378

Primary Examiner—Mark V. Prenty
Attorney, Agent, or Firm—Antonelli, Terry, Stout & Kraus

[57] ABSTRACT

An integrated circuit wherein a MOSFET having a low ON resistance is incorporated is disclosed. Specifically, the circuit has a structure wherein a source region and a channel region are formed on one side of a gate electrode of the MOSFET and a drain lead-out region on the other.

20 Claims, 8 Drawing Sheets

SEMICONDUCTOR INTEGRATED CIRCUIT DEVICE WITH POWER MOSFET INCORPORATED

This is a continuation of U.S. application Ser. No. 07/779,855, filed Oct. 21, 1991, now abandoned, which is a continuation of U.S. application Ser. No. 07/528,897, filed May 29, 1990, now abandoned, which, in turn, is a continuation of U.S. application Ser. No. 07/221,372, filed Jul. 19, 1988, now abandoned.

BACKGROUND OF THE INVENTION

The present invention relates to a semiconductor integrated circuit device having vertical type power MOSFETs incorporated on a main surface of a semiconductor substrate, and particularly it relates to a technique of constructing a semiconductor integrated circuit device having power MOSFETs of low ON resistance and bipolar transistors mounted mixedly on the same substrate.

Regarding a technique of forming vertical type power MOSFETs on the main surface of a semiconductor substrate, descriptions are found in the Electronic Materials, Kabushiki Kaisha Kogyo Chosakai, September, 1981, pp. 22 to 28, and others. The object of this technique, however, is a discrete power MOSFET.

Figure 9:
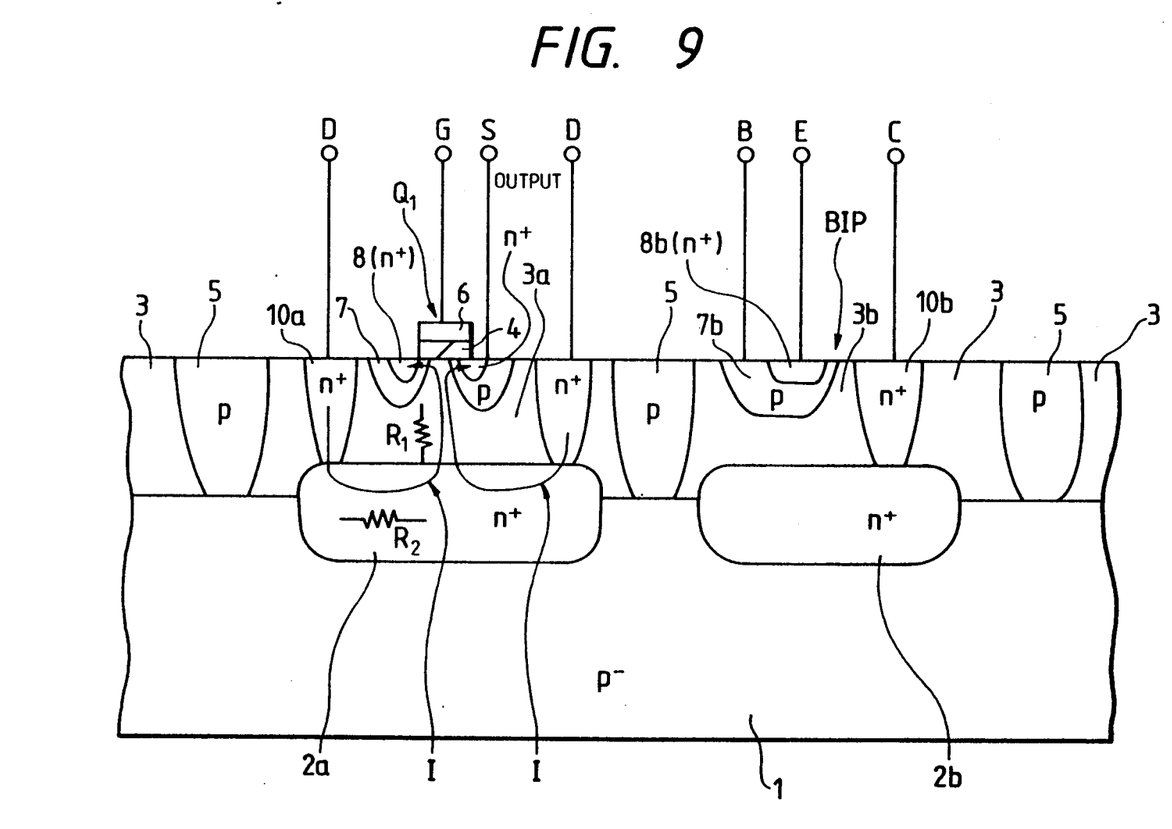
FIG. 9 is a sectional view of the principal part of a circuit which shows a structure of a conventional integrated circuit wherein a vertical type power MOSFET and a bipolar transistor are mounted mixedly on the same semiconductor substrate.

Besides, proposals have been made by the Motorola Company Incorporated and others on IC wherein vertical type power MOSFETs are formed in parts on a main surface of a semiconductor substrate and bipolar transistors are constructed on another part of the main surface thereof Said IC wherein the vertical type power MOSFETs and the bipolar transistors are formed on the same substrate has a structure, for instance, as shown in FIG. 9.

As shown in FIG. 9, an n+ type buried layer 2a for reducing a drain resistance of a vertical type power MOSFET $Q_1$ an n+ type buried layer 2b for reducing a collector resistance of an NPN-type bipolar transistor BIP are provided selectively on the surface of a p− type silicon substrate 1. Moreover, an n− type epitaxial layer 3 is formed on the whole surface of said p− type silicon substrate 1. Said n− type epitaxial layer 3 is separated electrically to form a plurality of insular (or island) regions by p-type isolation layers 5. In one of said insular regions, the vertical type power MOSFET $Q_1$ comprises a gate electrode 6 made of polysilicon, a source region 8 and a drain region 3a is formed. A p-type diffused region 7 forms a channel region of said vertical type power MOSFET $Q_1$. Numeral 4 denotes a gate insulating film. Moreover, a drain lead-out region 10a formed by diffusing n-type impurities from the surface of the n− type epitaxial layer 3 is connected electrically to the n+ type buried layer 2a which becomes a part of the drain region of the vertical type power MOSFET $Q_1$. A supply potential $V_{CC}$ (12 V) is impressed, for instance, on said drain lead-out region 10a. A current path I at the time of operation of the vertical type power MOSFET runs through the drain regions 2a, 3a from the drain lead-out region 10a as shown in the same figure. It runs further through the channel region (p-type diffused region 7), reaches the source region 8 and is outputted outside. Resistance $R_1$, $R_2$ are parasitic resistances of the drain regions 3a, 2a themselves.

In the insular region adjacent to the insular region in which the vertical type power MOSFET is formed, the NPN-type bipolar transistor BIP comprising an emitter region 8b, a base region 7b and a collector region 3b is formed. Besides, an n+ type diffused layer 10b for leading out a collector is connected electrically to the n+ type buried layer 2b.

SUMMARY OF THE INVENTION

The present inventors examined the above-stated structure wherein the vertical type power MOSFET and the bipolar transistor were formed on the same semiconductor substrate, and, as a result of such, study they have found therein the following problems.

In the structure shown in FIG. 9, the drain of the vertical type power MOSFET is taken out of the surface of an epitaxial layer through the n− type epitaxial layer 3 (3a) and the n+ type buried layer 2a. Therefore an effective series resistance caused by the parasitic resistances $R_1$, $R_2$ becomes large and, consequently, the ON resistance of the vertical type power MOSFET becomes large. This produces a fault as a result of heat being generated when the device operates. Moreover, the vertical type power MOSFET and the bipolar transistor are manufactured in separate processes from each other, which can result in a fault because of the increased number of manufacturing processes required.

The present invention, which overcomes the above-stated problems, is aimed at implementing a structure and a manufacturing method of a semiconductor integrated circuit device which would make it possible to incorporate the vertical type power MOSFET in an IC (Integrated Circuit) of bipolar transistors or MOSFETs and moreover to such as device wherein the ON resistance of the vertical type power MOSFET incorporated in the IC would be held to a low value.

Objects and novel characteristics of the present invention will become apparent from the description of the present specification and the drawings attached thereto.

An example of the invention disclosed in the present application can be summarized simply as follows.

A gate electrode structured as a plurality of gate electrode strips of a vertical type power MOSFET formed of a polycrystalline silicon film is provided on an n− type epitaxial layer of silicon formed on the surface of a p− type semiconductor substrate and insulated therefrom by an insulating film interlaid between the electrode and the epitaxial layer, and an n+ type diffused layer for leading out a drain is provided within said n− type epitaxial layer in a region thereof which is associated with two adjacent ones out of plurality of gate electrodes electrode strips provided in a plurality. Moreover, a p-type diffused layer which corresponds to a channel region and an n+ type diffused layer which is the source region are provided, in this structure, on the outside of each of the two adjacent gate electrodes (electrode strips).

The manufacturing method of the present invention comprises a process of forming the n− type epitaxial layer on the surface of the p− type semiconductor substrate, a process of forming a plurality of gate electrodes on the n− type epitaxial layer with the insulating film interlaid between, and a process of ion-implanting n-type impurities, in self-alignment, into the epitaxial layer in the region which is associated with two adjacent ones out of the plurality of the gate electrodes (electrode strips) corresponding to respective MOSFETs, using the two adjacent gate electrodes as masks.

According to the above-described means, the series resistance caused by the parasitic resistances $R_1$, $R_2$ of drain regions can be lowered, since the drain lead-out region for the vertical type power MOSFET and the channel region are close to each other. Therefore it is possible to make the ON resistance of the vertical type power MOSFET lower than that in the structure shown in FIG. 9. It is also possible to hold down the generation of heat at the time of operation of the vertical type power MOSFET, which results in an increase in the parasitic resistance.

Moreover, the drain lead-out region can be formed in self-alignment with regard to the two adjacent gate electrodes, since it is formed by ion implantation of impurities with the two adjacent gate electrodes used as masks. This brings forth the advantage in that the semiconductor integrated circuit device having the vertical type power MOSFET incorporated can be readily integrated with a high integration density. There is also another advantage in that higher integration can be attained since a drain region is designed to be common to the two adjacent gate electrodes.

DESCRIPTION OF THE PREFERRED EMBODIMENTS

Figure 1:
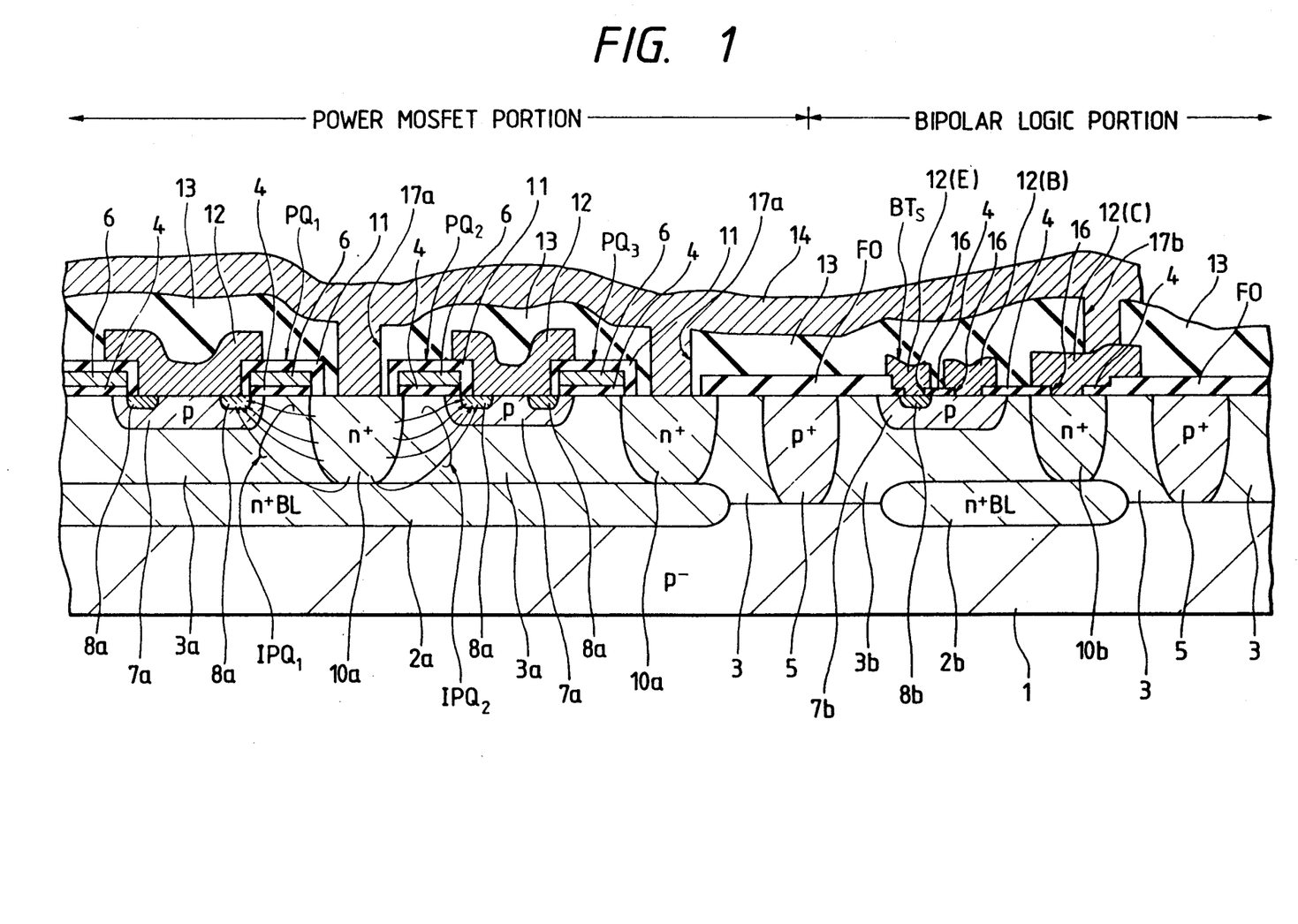
FIG. 1 is a sectional view showing a structure of an integrated circuit which is an embodiment of the present invention and wherein a vertical type power MOSFET and a bipolar transistor are formed together on the same semiconductor substrate.

FIG. 1, which shows an embodiment of the present invention, is a sectional view of the principal part of a circuit wherein a vertical type power MOSFET and an NPN-type bipolar transistor are mounted mixedly on the same semiconductor substrate.

In FIG. 1, n+ type buried layers $2a$, $2b$ are formed on the surface of a p− type silicon substrate 1 by selective ion implantation of n-type impurities. Moreover, an n− type epitaxial layer 3 is formed on the whole surface of said p− type silicon substrate 1 by an epitaxial growth method. Said epitaxial layer 3 is separated electrically by a p+ type isolation layer 5, so as to form a plurality of electrically separated insular (or island) regions (e.g. $3a$, $3b$). On the main surface of the epitaxial layer 3 located in the POWER MOSFET PORTION in the FIG. 1, a gate electrode made of polysilicon 6 of the vertical type power MOSFET is formed. Numeral 4 denotes a gate insulating film of $SiO_2$.

On the surface of the n− type epitaxial layer on one side of each gate electrode 6, a p-type semiconductor region $7a$ for a channel region and a source region $7a$ are formed.

In the sectional view of FIG. 1, the gate electrode 6 provided as a plurality of gate electrodes which seem to be separated electrically from each other are in actuality, however, formed such that each gate electrode 6 of vertical type power MOSFETs $PQ_2$, $PQ_3$ is connected with the other in a substantially polygonal or circularly formed configuration with respect to a plan view, and further each gate electrode 6 of vertical type power MOSFETs $PQ_1$, $PQ_2$ is also connected with the other through the same polysilicon layer. For an easy understanding, the vertical type power MOSFET is described herein as formed by combination of a plurality of MOSFETs, but when viewed in terms of the function of the device, such a combined plurality of MOSFETs are regarded as constituting one vertical type power MOSFET as a whole (see FIG. 3).

A drain lead-out region $10a$ is formed on the surface of the n− type epitaxial layer on the other side of each of the gate electrodes 6. Moreover, the drain lead-out region $10a$ is connected electrically to the n+ type buried layer $2a$ to reduce the parasitic series resistance of drains. This drain lead-out region $10a$ is provided in a region prescribed by each gate electrode 6 of the vertical type power MOSFETs $PQ_1$ and $PQ_2$, for instance. The drain lead-out region $10a$ is one which is common to the vertical type power MOSFETs $PQ_1$ and $PQ_2$. By adopting such a structure of the vertical type power MOSFET as described above, the source region of each power MOSFET and the drain lead-out region are formed in close vicinity to each other, and therefore the channels ($IPQ_1$, $IPQ_2$) of a corresponding current path between a source and a drain at the time of the operation of the power MOSFETs can be shortened. This enables the reduction of a parasitic resistance (series resistance) caused by the drain regions $3a$ and the n+ type buried layer $2a$ becoming a part of drain regions, and as result, the ON resistance of the vertical type power MOSFET can be kept at a low value when this MOSFET is incorporated in an IC.

On the surface of the p-type semiconductor region $7a$ for the channel region and the source region $8a$, an electrode 12 is formed of an aluminum layer (or aluminum-silicon alloy layer). This electrode 12 is formed of a first aluminum layer and is connected, for instance, to a load L of FIG. 2, on which a description will be made later. The electrode 12 and the gate electrode 6 are isolated electrically from each other by an insulating film 11 formed of $SiO_2$.

In a BIPOLAR LOGIC PORTION of FIG. 1, on the other hand, an NPN-type bipolar transistor $BT_s$ is formed by an emitter region $8b$ being an n+ type diffused region, a base region $7b$ being a p-type diffused region, and an n− epitaxial layer $3b$ being a collector.

This NPN-type bipolar transistor $BT_s$ is isolated electrically from other insular regions by a p+ type isolation region 5 and a field insulating film OF formed of $SiO_2$. Moreover, in order to reduce the collector resistance of the NPN-type bipolar transistor $BT_s$, an n+ type buried layer $2b$ and a collector lead-out region $10b$ are provided on the surface of the p− type semiconductor substrate 1 and in the n− type epitaxial layer $3b$, respectively. The drain lead-out region $10a$ and the collector lead-out region $10b$ are formed in the same manufacturing process, and therefore the manufacturing processes therefore can be simplified. In addition, the source region $8a$ and emitter region $8b$, and, the p-type diffused region $7a$ and the base region $7b$, can also be formed in the same manufacturing processes respectively, and therefore manufacturing processes can further be simplified. On the surfaces of the emitter region 8b, base region 7b and collector lead-out region 10b, electrodes 12 (E), 12 (B) and 12 (C) are formed respectively of the first aluminum layer (or aluminum-silicon alloy layer) through an opening 16 of the insulating film 4 of SiO$_2$.

Figure 2:
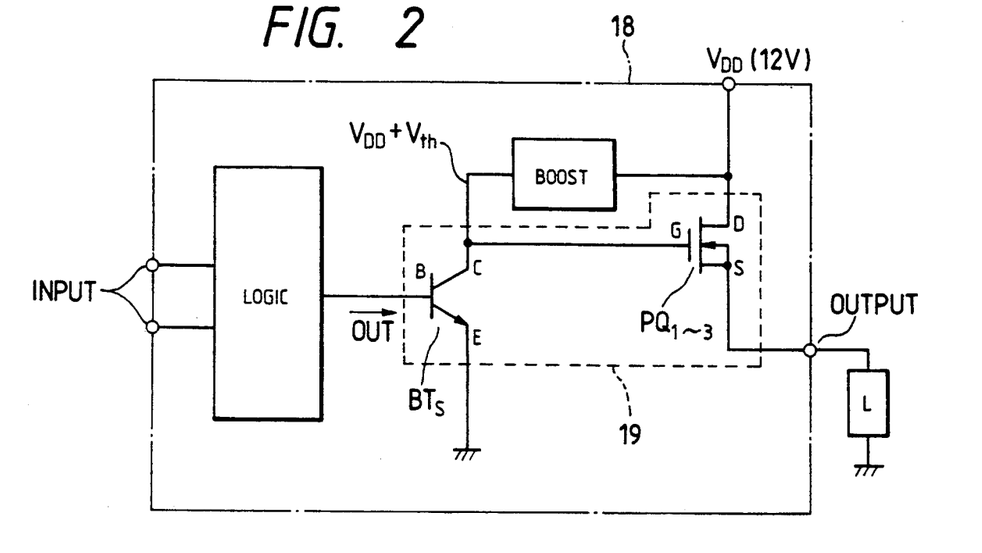
FIG. 2 is a circuit diagram for exemplifying an operation of the integrated circuit of FIG. 1.

The above-described NPN-type bipolar transistor BT$_S$ is employed as a drive transistor driving the above-mentioned, vertical type power MOSFET (see FIG. 2). A plurality of transistors having the same structure as said NPN-type bipolar transistor BT$_S$ are formed in the above-mentioned n$^-$ type epitaxial layer 3 so as to constitute a logic circuit LOGIC (see FIG. 2).

Furthermore, an interlayer insulating film 13 formed of a PSG film, for instance, is provided over the electrodes 12, 12 (E), 12 (B) and 12 (C) formed of the first aluminum layer. In desired regions of said interlayer insulation film 13 openings 17a and 17b are provided, respectively, through which a wiring layer 14 formed of a second aluminum layer (or aluminum-silicon alloy layer) is connected to the drain lead-out region 10a and the collector lead-out region 10b. On said wiring layer 14, a supply potential V$_{DD}$ (12 V) is impressed, for instance.

By combining the vertical type power MOSFET and the NPN-type bipolar transistor having such structures respectively as described above, a circuit 19 (indicated by a dotted line) in FIG. 2, for instance, can be constructed on one semiconductor substrate.

FIG. 2 shows a state wherein a plurality of circuits are constructed on one semiconductor chip 18.

The drain D of a vertical type power MOSFET PQ$_{1-3}$ is connected to a supply voltage V$_{DD}$ (12 V), while a gate G is provided with a drive circuit formed by a drive bipolar transistor BT$_S$. For an operating voltage of the drive circuit, a voltage V$_{CC}$+V$_{th}$ obtained by boosting the supply voltage V$_{DD}$ by means of a booster circuit BOOST is employed. The base B of the drive bipolar transistor BT$_S$ is supplied with a control signal OUT through the logic circuit LOGIC, although no particular limitation is given thereto. Said logic circuit LOGIC is operated by an input signal INPUT given from outside. The operating voltage of the logic circuit LOGIC is set to be of a 5 V system, which is lower relatively than the supply voltage V$_{DD}$, though not limited thereto. In accordance with said voltage, when the high level of the control signal OUT is set to be of 5 V, the output signal of drive circuit 19 at terminal OUTPUT becomes a relatively low logic level as such grounding potential. Accordingly, the drive circuit consisting of the logic circuit LOGIC and bipolar transistor BT$_S$ conducts a kind of level converting operation.

The power MOSFET PQ$_{1-3}$ is provided with a load inductance L at the source S thereof.

When the control signal OUT is at a low level, for instance, the bipolar transistor BT$_S$ is placed in an OFF state, and the boosted operating voltage V$_{DD}$+V$_{th}$ is supplied to the gate G of the power MOSFET PQ$_{1-3}$. If the boosted voltage V$_{DD}$+V$_{th}$ formed by the booster circuit BOOST is set to be higher than a substantial threshold voltage of the power MOSFET PQ$_{1-3}$, the supply voltage V$_{DD}$ is outputted without any amplitude loss, such as the threshold voltage of the power MOSFETs, source S of the power MOSFET PQ$_{1-3}$ when the MOSFET is in an ON state, and therefore a high output voltage can be obtained.

Figure 3:
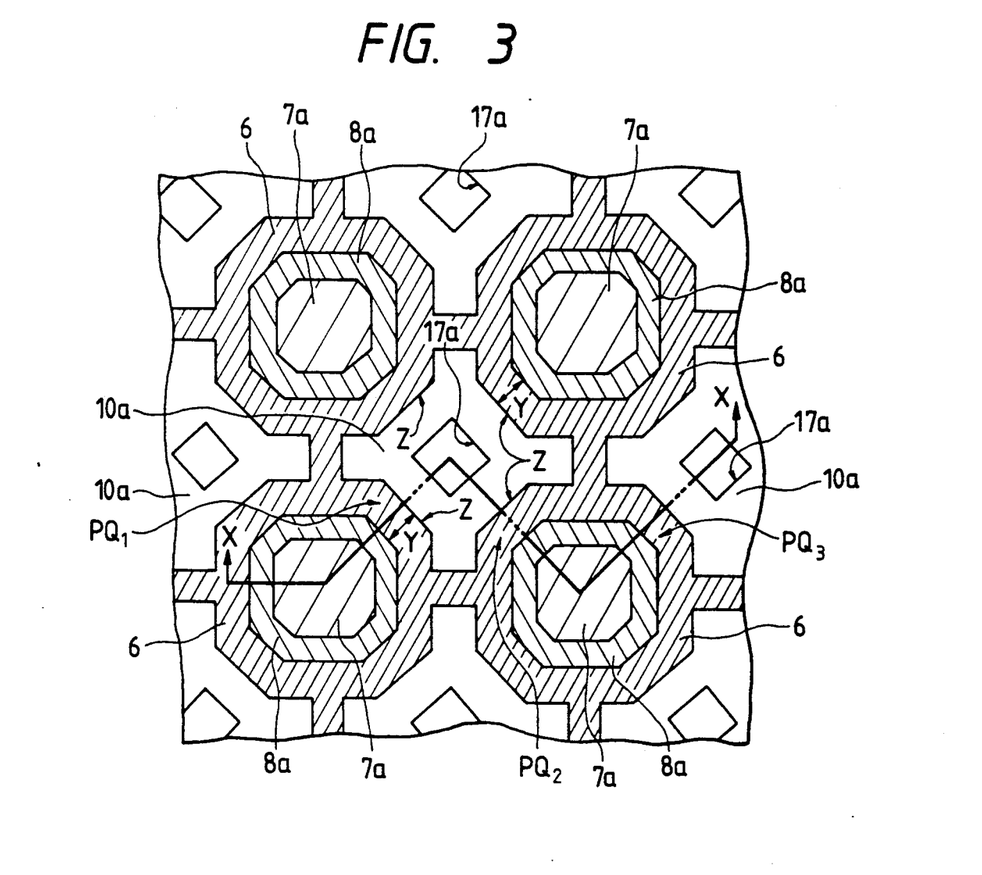
FIG. 3 is a plan view of the principal part of the circuit corresponding to FIG. 1.

Next, a plan view of POWER MOSFET PORTION of FIG. 1 is shown in FIG. 3. The sectional view of FIG. 1 is the view of a section taken along a line X—X of FIG. 3. As shown in FIG. 3, a gate electrode 6 has amish-like pattern formed so as to be substantially shaped circular or polygonal-shaped, and a source region 8a and a p-type semiconductor region 7a for forming a channel region are formed inside said gate electrode 6. Outside of the gate electrode 6, a drain lead-out region 10a is formed in a region prescribed by the contours Z of gate electrodes 6. Besides, an aluminum wiring layer 14, as a second aluminum layer, is connected to the drain lead-out region 10a through an opening 17a of an interlayer insulation film 13, not shown in the FIG. 3.

By having the layout of the vertical type power MOSFET in this way, the distance between the source region 8a and the drain lead-out region 10a can be made as small as the width Y of the gate electrode 6. Accordingly, the parasitic resistances R$_1$, R$_2$ of the above-mentioned drain regions 3a, 2a can be decreased, and thus the ON resistance of the power MOSFET can be made small.

Figure 4:
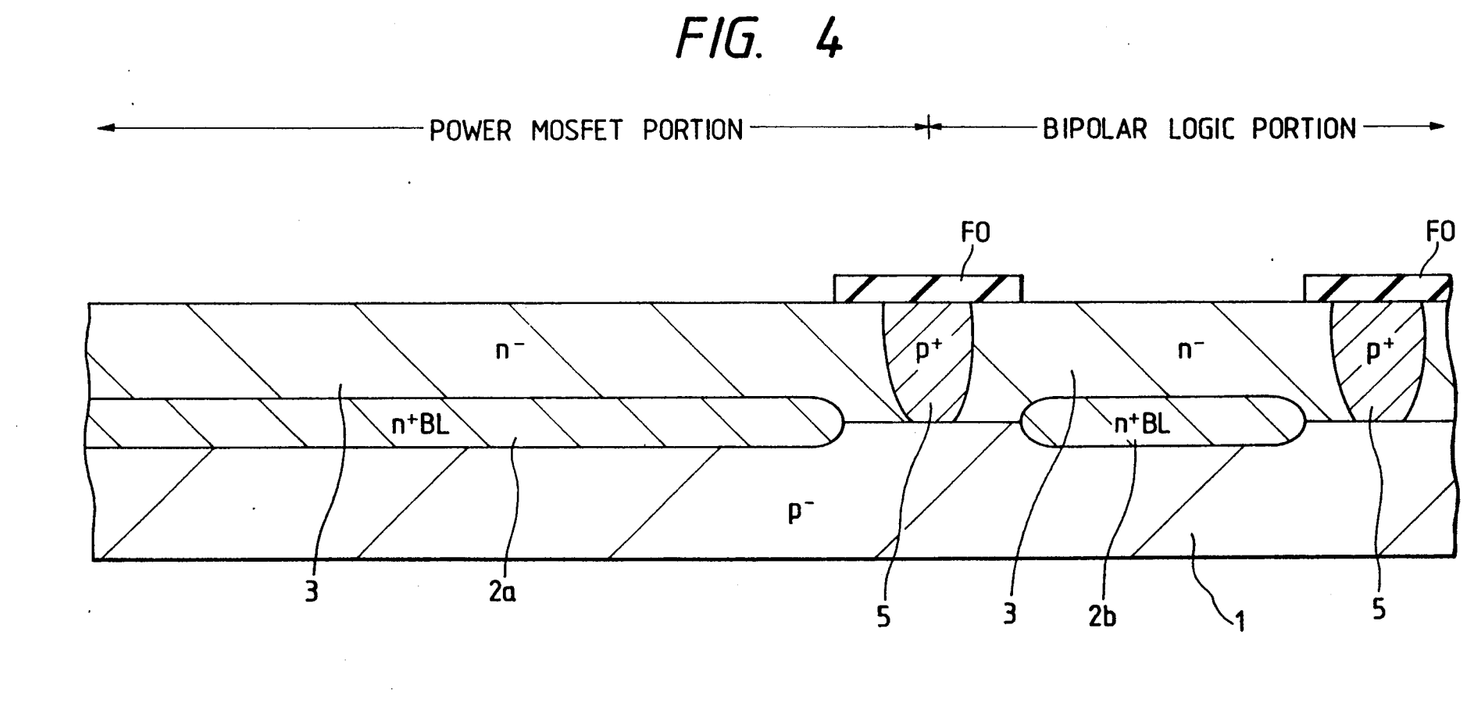
FIG. 4 to FIG. 8 are sectional views of the principal part of the circuit which show, in the sequence of manufacturing processes, a manufacturing method of the integrated circuit which is the embodiment of the present invention and wherein the vertical type power MOSFET and the bipolar transistor are mounted mixedly on the same semiconductor substrate.

Next, a manufacturing method of the structure shown in FIG. 1 will be described by using FIGS. 4 to 8. As shown in FIG. 4, n$^+$ type buried layers 2a and 2b are formed simultaneously on the surface of a p$^-$ type semiconductor substrate 1 formed of silicon, by means of selective ion implantation of antimony (Sb), for instance. Then, an n$^-$ type epitaxial layer 3 of silicon is formed on the whole surface of said p$^-$ type semiconductor substrate 1 by an epitaxial growth method, for instance. Thereafter, a mask of a photoresist not shown in the figure being used, a p$^+$ type isolation region 5 is formed by ion-implanting boron (B), for instance, into said n$^-$ type epitaxial layer 3. Next, on said p$^+$ type isolation region 5, a field insulating film FO of SiO$_2$, for instance, is formed by a CVD method or the selective thermal oxidation of the n$^-$ type epitaxial layer 3, for instance. By the p$^+$ type isolation region 5 and field insulating film FO, the n$^-$ type epitaxial layer 3 is formed into a plurality of electrically isolated insular regions 3a and 3b.

Figure 5:
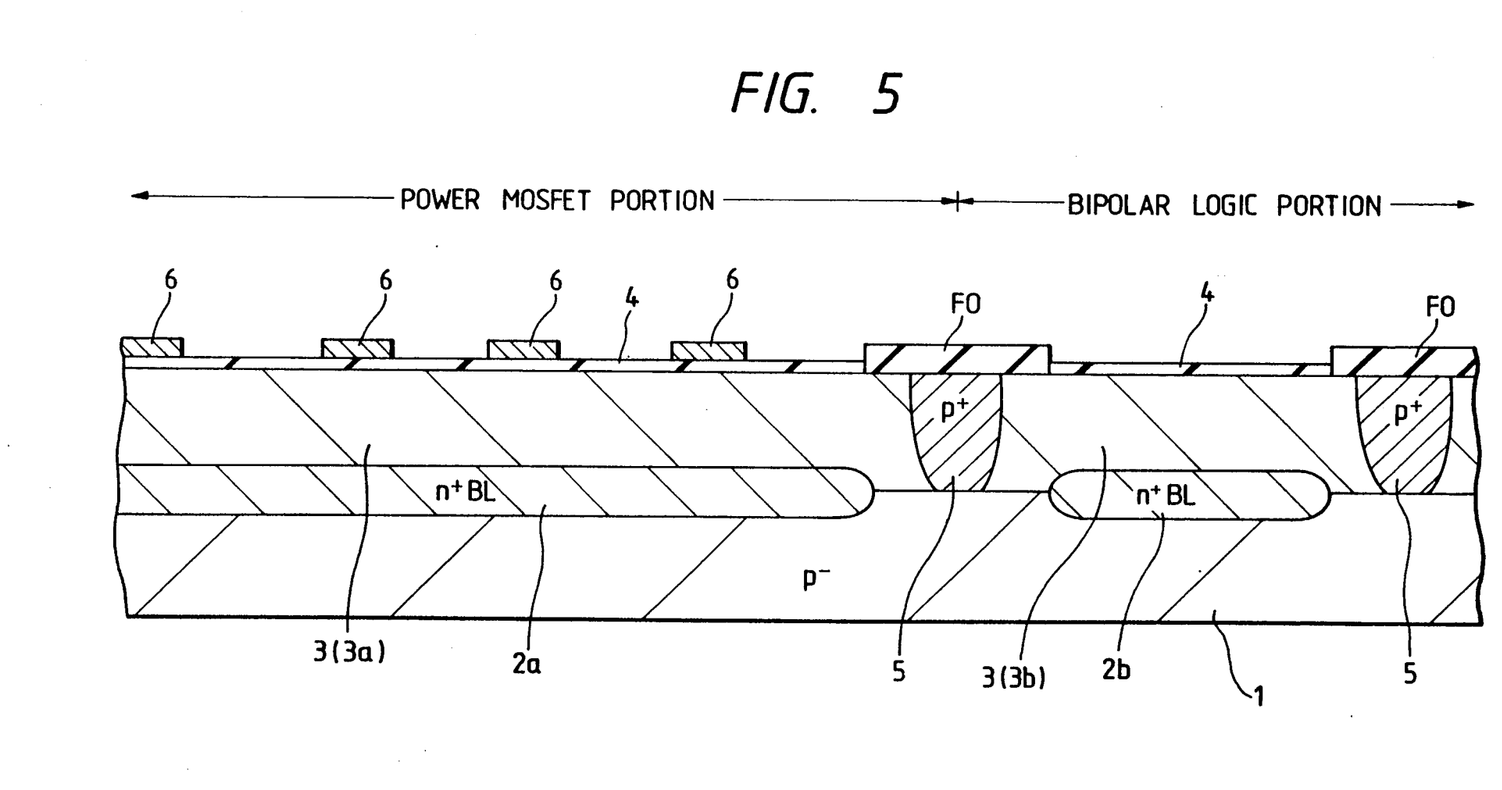

Then, a gate insulating film 4 of SiO$_2$ is formed, as shown in FIG. 5, by the thermal oxidation of the surface of the n$^-$ type epitaxial layer 3. After a poly-Si film is formed on said gate insulating film 4 by the CVD method, for instance, only the poly-Si film which is on the line region wherein a source-drain element is to be effected is etched selectively with a photoresist mask used, so as to form a plurality of poly-Si gate electrodes 6 on the surface of one insular region 3a.

Figure 6:
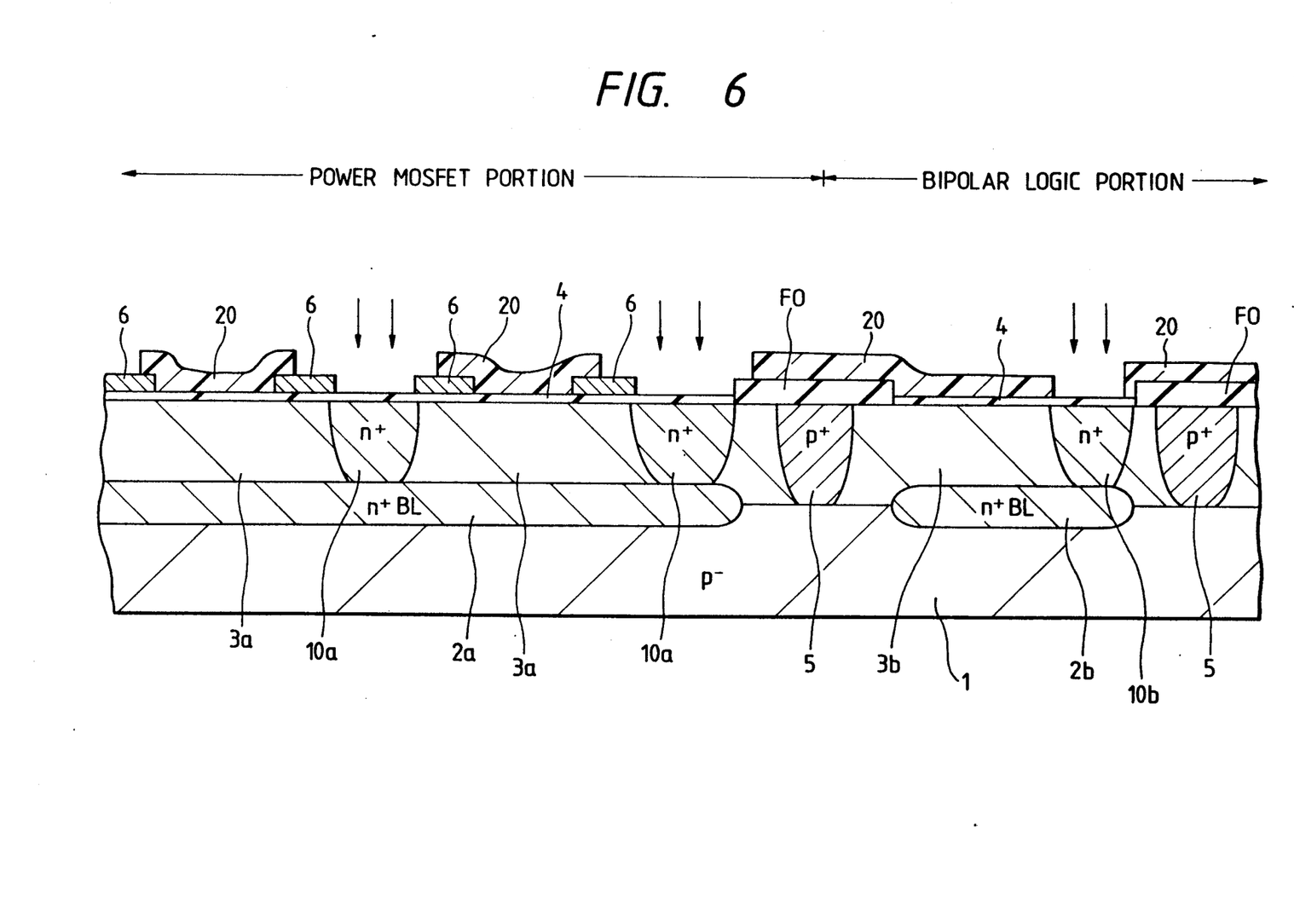

Next, as shown in FIG. 6, a region wherein a source region 8a of the vertical type power MOSFET and a p-type semiconductor region 7a are to be formed and a part of BIPOLAR LOGIC PORTION are covered with a mask 20 of a photoresist or HLD (high-temperature low-pressure deposition) SiO$_2$, and a drain lead-out region 10a and a collector lead-out region 10b connecting with the n$^+$ buried layers 2a and 2b, respectively, are formed by ion implantation and diffusion of P (phosphorus), for instance, using said mask 20 and the gate electrodes 6 as masks.

Figure 7:
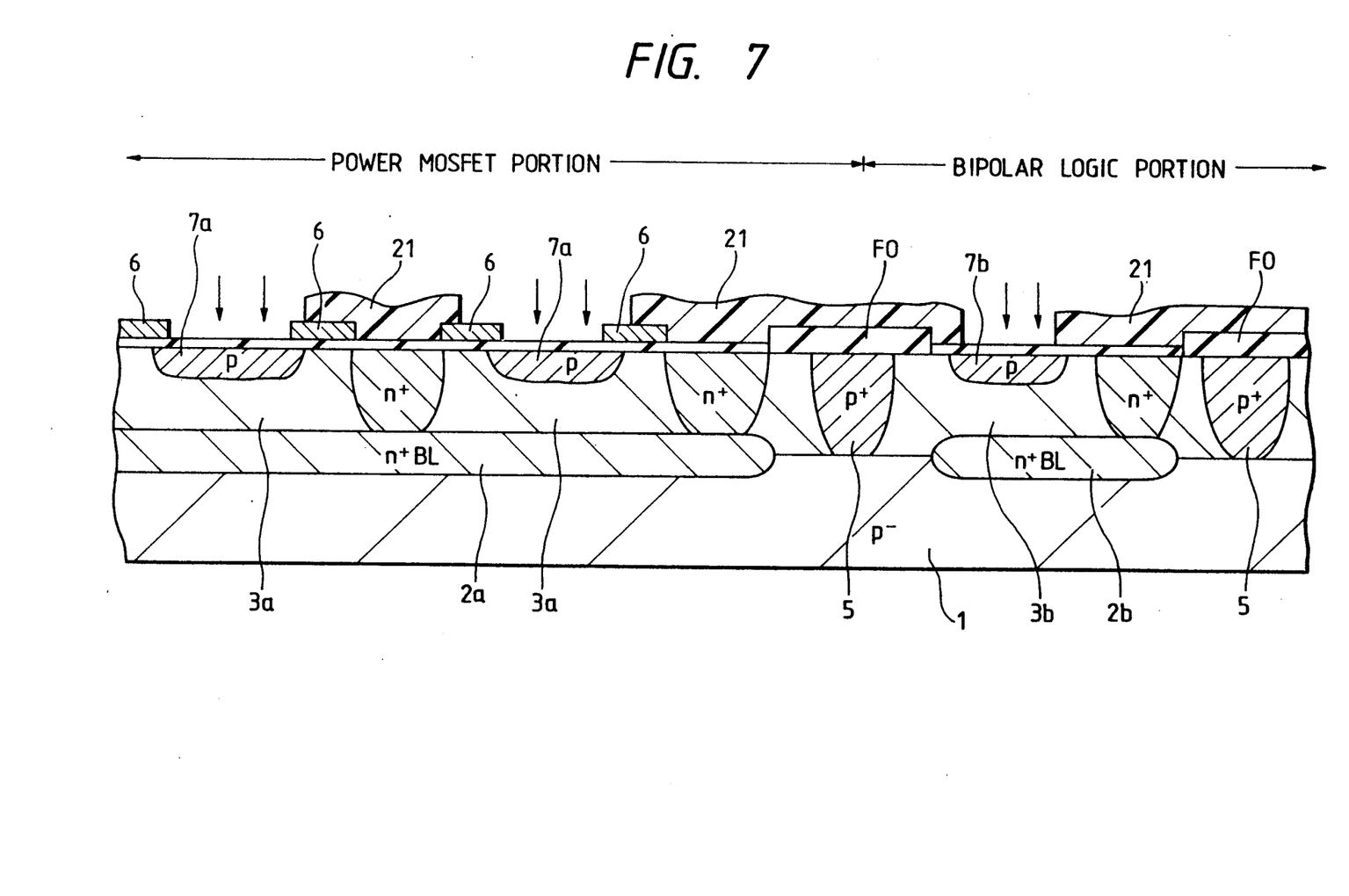
Figure 8:
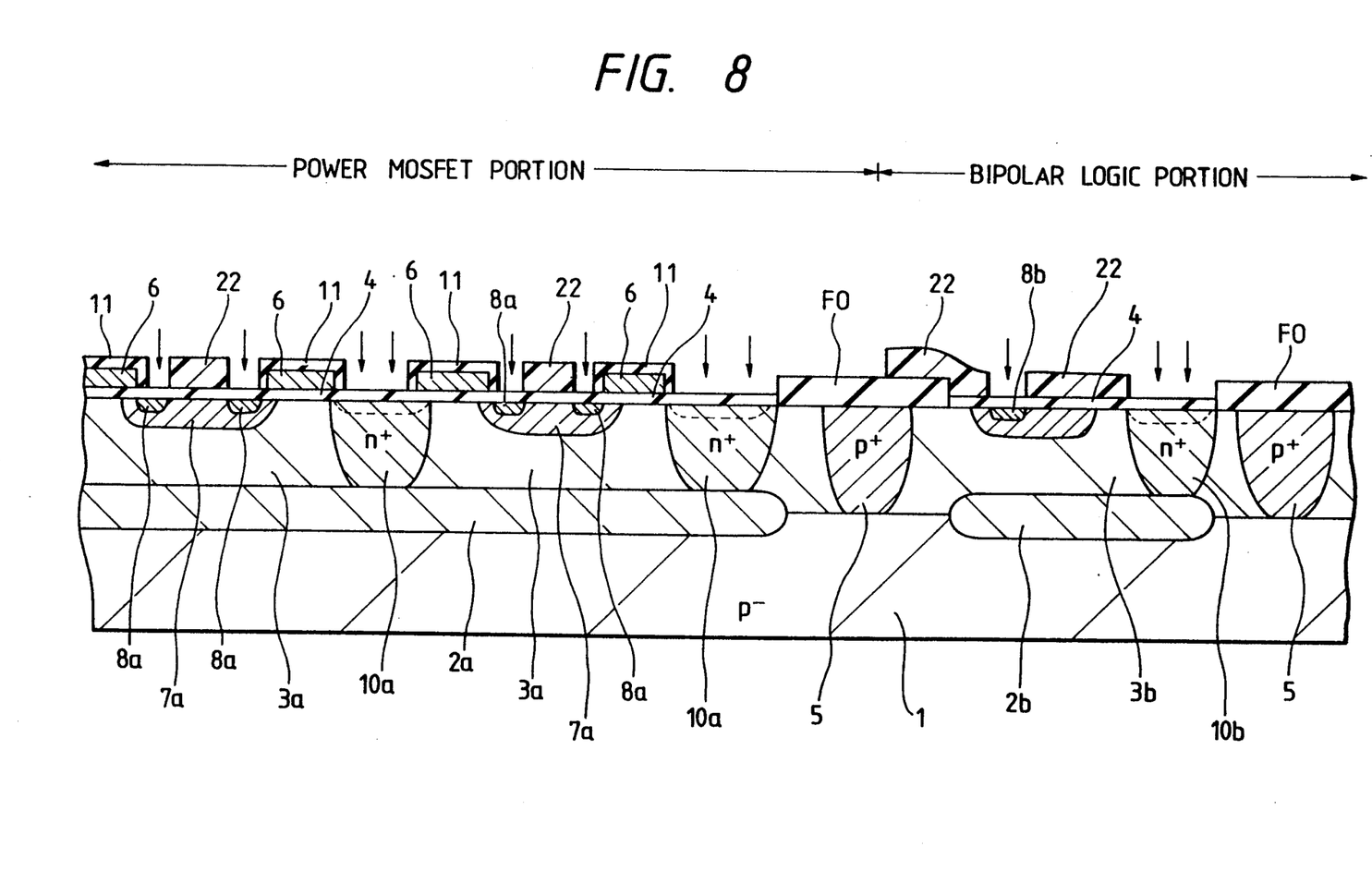

After the photoresist film 20 is removed, the drain lead-out region 10a and a prescribed region of BIPOLAR LOGIC PORTION are covered with a photoresist film 21, as shown in FIG. 7, and a p-type semiconductor region 7a to be a channel region of the vertical type power MOSFET and a base region 7b of the NPN-type bipolar transistor are formed by ion implantation of boron (B), for instance. The impurity concentration of said p-type semiconductor region 7a is about $10^{14-18}$ atoms/cm$^3$, for instance. After the photoresist film 21 is removed, an insulation film 11 of SiO$_2$ is formed by thermally oxidizing the gate electrode 6 of polysilicon. Thereafter, a photoresist film 22 is formed particularly on the p-type semiconductor region 7a and base region 7b, as shown in FIG. 8, and a source region 8a and an emitter region 8b are formed by ion implantation of arsenic (As), for instance, with said photoresist film 22 and the gate electrode 6 used as masks. On the occasion, arsenic (As) is introduced into the drain lead-out region 10a and collector lead-out region 10b as well. This enables the reduction of resistance of contact with an aluminum wiring 14 which is to be formed later. The impurity concentration of the source region 8a and the emitter region 8b is $10^{19-21}$ atoms/cm$^3$, for instance.

Then, after the photoresist film 22 is removed, as shown in FIG. 1, the insulating film 4 is patterned by selective etching using a photoresist film not shown in the figure, and further first-layer Al, which contacts with the source region 8a, p-type semiconductor region 7a, emitter region 8b, base region 7b and collector lead-out region 10b, is evaporated and etched for patterning to form a source electrode 12 and electrodes 12 (E), 12 (B) and 12 (C). After an interlayer insulating film 13 is formed thereafter, second-layer Al, which contacts with the drain lead-out region 10a and the collector lead-out region 10b, is evaporated and etched for patterning to form a wiring layer 14.

An operational effect obtained from the above-described embodiment is as follows.

A series resistance due to the parasitic resistance of a drain region can be reduced, since the drain lead-out region of the vertical type power MOSFET and a channel region are in close vicinity to each other. Therefore it is possible to make the ON resistance of the vertical type power MOSFET lower than that in the structure shown in FIG. 9. Besides, it is also possible to hold down the generation of heat at the time of operation of the vertical type power MOSFET, which would otherwise result from an increases of the parasitic resistance.

Moreover, said drain lead-out region can be formed in self-alignment with regard to two adjacent gate electrodes (electrode strips), since it is formed by ion implantation of impurities with said two adjacent gate electrodes used as masks. This brings forth also the advantage in that a semiconductor integrated circuit device having the vertical type power MOSFET incorporated can be implemented with a high integration density. Furthermore, the drain region for the two adjacent gate electrodes is designed to be common to both, and this brings forth another advantage in that even higher integration density can be attained.

What is claimed is:

1. A semiconductor device having a MOSFET comprising:
    a semiconductor substrate of a first conductivity type;
    an epitaxial semiconductor layer of a second conductivity type, opposite to said first conductivity type, formed on said semiconductor substrate, said epitaxial semiconductor layer being used as a common drain region of said MOSFET and having a main surface;
    an insulated gate electrode of said MOSFET formed on said main surface of said epitaxial semiconductor layer, said insulated gate electrode having a mesh-like pattern and dividing said main surface of said epitaxial semiconductor layer into plural main surface areas, with respect to a plan view thereof, corresponding to a plurality of first regions, respectively;
    a plurality of first semiconductor layers of said first conductivity type formed at said main surface in first selected regions from among said plurality of first regions, each of said first semiconductor layers having a portion which is extended so as to at least partially underlie said insulated gate electrode in an orthogonally overlapping fashion and which is used as a channel region of said MOSFET;
    a plurality of second semiconductor layers of said second conductivity type formed in said first semiconductor layers, each of said second semiconductor layers being used as a source region of said MOSFET; and
    a plurality of third semiconductor layers of said second conductivity type formed at said main surface in second selected regions from among said plurality of first regions, said second selected regions being different from said first selected regions, each of said third semiconductor layers having an impurity concentration higher than that of said epitaxial semiconductor layer and being used as a drain contact region of said MOSFET,
    wherein said second selected regions in which said third semiconductor layers are formed, are selected from among said first regions so that a plurality of drain contact regions are disposed close to each of said first semiconductor layers formed in said first selected region.

2. A semiconductor device according to claim 1, further comprising:
    a buried semiconductor layer of said second conductivity type formed at the junction between said semiconductor substrate and said epitaxial semiconductor layer, said buried semiconductor layer having an impurity concentration higher than that of said epitaxial semiconductor layer,
    wherein said buried semiconductor layer together with said epitaxial semiconductor layer are used as said common drain region of said MOSFET.

3. A semiconductor device according to claim 2, wherein said insulated gate electrode includes a polycrystalline silicon film doped with impurities of an n-type.

4. A semiconductor device according to claim 3, further comprising:
    a common drain electrode formed over said main surface of said epitaxial semiconductor layer,
    wherein said common drain electrode is electrically connected to said third semiconductor layers via through holes formed in an insulating film between said main surface and said common drain electrode.

5. A semiconductor device according to claim 4, wherein said insulated gate electrodes includes a plurality of gate electrode strips in a cross-sectional view, and wherein each of said third semiconductor layers is formed between said gate electrode strips adjacent to each other and is formed in self-alignment with said gate electrode strips.

6. A semiconductor device according to claim 2, further comprising:
    a common drain electrode formed over said main surface of said epitaxial semiconductor layer, wherein said common drain electrode is electrically connected to said third semiconductor layers via through holes formed in an insulating film between said main surface and said common drain electrode.

7. A semiconductor device according to claim 2, wherein said insulated gate electrode includes a plurality of gate electrode strips in a cross-sectional view, and wherein each of said third semiconductor layers is formed between said gate electrode strips adjacent to each other and is formed in self-alignment with said gate electrode strips.

8. A semiconductor device according to claim 1, wherein each of said third semiconductor layers used as said drain contact region includes a first sub-region having a shallow junction depth and a second sub-region having a junction depth deeper than said shallow junction depth.

9. A semiconductor device according to claim 8, wherein said insulated gate electrode includes a polycrystalline silicon film doped with impurities of an n-type.

10. A semiconductor device according to claim 9, wherein said insulated gate electrode includes a plurality of gate electrode strips in a cross-sectional view, and wherein each of said third semiconductor layers is formed between said gate electrode strips adjacent to each other and is formed in self-alignment with said gate electrode strips.

11. A semiconductor device according to claim 1, wherein said insulated gate electrode includes a polycrystalline silicon film doped with impurities of an n-type.

12. A semiconductor device according to claim 1, further comprising:
a common drain electrode formed over said main surface of said epitaxial semiconductor layer,
wherein said common drain electrode is electrically connected to said third semiconductor layers via through holes formed in an insulating film between said main surface and said common drain electrode.

13. A semiconductor device according to claim 1, wherein said insulating gate electrode includes a plurality of gate electrode strips in a cross-sectional view, and wherein each of said third semiconductor layers is formed between said gate electrode strips adjacent to each other and is formed in self-alignment with said gate electrode strips.

14. A semiconductor device having a MOSFET comprising:
a semiconductor substrate of a first conductivity type;
an epitaxial semiconductor layer of a second conductivity type, opposite to said first conductivity type, formed on said semiconductor substrate, said epitaxial semiconductor layer being used as a common drain region of said MOSFET and having a main surface;
a gate electrode of said MOSFET formed on said main surface of said epitaxial semiconductor layer, said gate electrode having a mesh-like pattern and dividing said main surface of said epitaxial semiconductor layer into plural main surface areas, with respect to a plan view thereof, corresponding to a plurality of first regions, respectively;
a plurality of first semiconductor layers of said first conductivity type formed at said main surface in first selected regions from among said plurality of first regions, each of said first semiconductor layers having a portion which is extended so as to at least partially underlie said gate electrode in an orthogonally overlapping fashion and which is used as a channel region of said MOSFET;
a plurality of second semiconductors layers of said second conductivity type formed in said first semiconductor layers, each of said second semiconductor layers being used as a source region of said MOSFET; and
a plurality of third semiconductor layers of said second conductivity type formed at said main surface in second selected regions from among said plurality of first regions, said second selected regions being different from said first selected regions, each of said third semiconductor layers having an impurity concentration higher than that of said epitaxial semiconductor layer and being used as a drain contact region of said MOSFET,
wherein each of said third semiconductor layers used as said drain contact region is surrounded by said second semiconductor layers used as said source region, while each of said second semiconductor layers used as said source region is surrounded by said third semiconductor layers used as said drain contact region.

15. A semiconductor device according to claim 14, wherein four drain contact regions surround each of said second semiconductor layers used as said source region.

16. A semiconductor device according to claim 15, wherein four source regions surround each of said third semiconductor layers used as said drain contact region.

17. A semiconductor device according to claim 16, further comprising:
a common drain electrode formed over said main surface of said epitaxial semiconductor layer,
wherein said common drain electrode is electrically connected to said third semiconductor layers via through holes formed in an insulating film between said main surface and said common drain electrode.

18. A semiconductor device according to claim 17, further comprising:
a common source electrode formed over said main surface of said epitaxial semiconductor layer,
wherein said common source electrode is electrically connected to said first and second semiconductor layers via through holes formed in an insulating film between said main surface and said common source electrode, and wherein said common drain and source electrodes are electrically isolated from each other.

19. A semiconductor device according to claim 14, further comprising:
a common drain electrode formed over said main surface of said epitaxial semiconductor layer,
wherein said common drain electrode is electrically connected to said third semiconductor layers via through holes formed in an insulating film between said main surface and said common drain electrode.

20. A semiconductor device according to claim 19, further comprising:
a common source electrode formed over said main surface of said epitaxial semiconductor layer,
wherein said common source electrode is electrically connected to said first and second semiconductor layers via through holes formed in an insulating film between said main surface and said common source electrode, and wherein said common drain and source electrodes are electrically isolated from each other.

* * * * *